(12) United States Patent
Sinha et al.

(10) Patent No.: US 8,603,363 B1
(45) Date of Patent: Dec. 10, 2013

(54) COMPOSITIONS FOR EXTENDING ION SOURCE LIFE AND IMPROVING ION SOURCE PERFORMANCE DURING CARBON IMPLANTATION

(75) Inventors: Ashwini K. Sinha, East Amherst, NY (US); Lloyd A. Brown, East Amherst, NY (US); Serge Campeau, Lancaster, NY (US)

(73) Assignee: Praxair Technology, Inc., Danbury, CT (US)

( * ) Notice: Subject to any disclaimer, the term of this patent is extended or adjusted under 35 U.S.C. 154(b) by 0 days.

(21) Appl. No.: 13/527,684

(22) Filed: Jun. 20, 2012

(51) Int. Cl.
*C09K 3/00* (2006.01)

(52) U.S. Cl.
USPC ........................................................ 252/372

(58) Field of Classification Search
USPC ........................................................ 252/372
See application file for complete search history.

(56) References Cited

U.S. PATENT DOCUMENTS

| | | | |
|---|---|---|---|
| 5,656,820 A | | 8/1997 | Murakoshi et al. |
| 5,770,098 A | * | 6/1998 | Araki et al. ............ 216/67 |
| 5,940,724 A | | 8/1999 | Warren |
| 5,943,594 A | | 8/1999 | Bailey et al. |
| 6,215,125 B1 | | 4/2001 | Chen et al. |
| 6,297,163 B1 | * | 10/2001 | Zhu et al. .............. 438/707 |
| 6,362,109 B1 | * | 3/2002 | Kim et al. .............. 438/706 |
| 6,399,511 B2 | * | 6/2002 | Tang et al. ............. 438/714 |
| 6,559,462 B1 | | 5/2003 | Carpenter et al. |
| 6,756,600 B2 | | 6/2004 | Ng et al. |
| 6,800,213 B2 | * | 10/2004 | Ding et al. ............. 216/67 |
| 7,030,029 B2 | * | 4/2006 | Tsuchiya ............... 438/714 |
| 7,329,610 B2 | * | 2/2008 | Tsuchiya ............... 438/714 |
| 7,586,109 B2 | | 9/2009 | Perel et al. |
| 7,655,931 B2 | | 2/2010 | Gupta |

* cited by examiner

*Primary Examiner* — Timothy Vanoy
(74) *Attorney, Agent, or Firm* — Nilay S. Dalal

(57) ABSTRACT

A novel method and system for extending ion source life and improving ion source performance during carbon implantation are provided. Particularly, the carbon ion implant process involves utilizing a dopant gas mixture comprising carbon monoxide and one or more fluorine-containing gas with carbon represented by the formula CxFy wherein x≥1 and y≥1. At least one fluorine containing gases with carbon is contained in the mixture at about 3-12 volume percent (vol %) based on the volume of the dopant gas mixture. Fluoride ions, radicals or combinations thereof are released from the ionized dopant gas mixture and reacts with deposits derived substantially from carbon along at least one of the surfaces of the repeller electrodes, extraction electrodes and the chamber to reduce the overall amount of deposits. In this manner, a single dopant gas mixture provides carbon ions and removes problematic deposits typically encountered during carbon implantation.

15 Claims, 4 Drawing Sheets

Schematic of an ion source apparatus

CO + 0% CF4

CO + 5% CF4

CO + 5% CF4

CO + 10% CF4

CO + 10% CF4

CO + 15% CF4

CO + 15% CF4

COMPOSITIONS FOR EXTENDING ION SOURCE LIFE AND IMPROVING ION SOURCE PERFORMANCE DURING CARBON IMPLANTATION

FIELD OF THE INVENTION

The present invention relates to a novel gas composition for extending ion source life and improving ion source performance during carbon implantation.

BACKGROUND OF THE INVENTION

Ion implantation is an important process in semiconductor/microelectronic manufacturing. The ion implantation process is used in integrated circuit fabrication to introduce controlled amounts of dopant ions into semiconductor wafers. An ion-source is used to generate a well-defined ion beam for a variety of ion species from a dopant gas. Ionization of the dopant gas generates the ion species which can be subsequently implanted into a given workpiece.

Carbon has emerged as a widely used dopant in the semiconductor industry for a variety of material modification applications such as inhibiting diffusion of co-dopants or enhancing stability of the doped region. In this regard, carbon dioxide ($CO_2$) and carbon monoxide (CO) are two commonly used dopant gas sources for carbon implantation. However, CO2 and CO are prone to accumulation of deposits along surfaces of the ion chamber. Additional deposits can form along surfaces of electrodes of the ion source apparatus. The deposits may form directly from the dopant gas or from interaction of the dopant gas and/or its ionization product with the chamber components.

Such deposit formation is problematic. Deposits along surfaces of the electrodes of an ion implantation system create conditions susceptible to energetic high voltage discharge. Voltage discharge results in momentary drops in the beam current, commonly referred to as "beam glitching". Deposits on the extraction aperture degrade the beam uniformity and hence the uniformity of dopant levels in the doped region. Beam uniformity and the number of beam glitches (i.e., glitch rate) during the operation of an ion source can be key metrics for the performance of an ion implantation system, such as, for example, a ribbon beam ion implantation system as commonly known in the art.

Based on the process sensitivity, there may be an upper threshold to the glitch rate and/or beam non-uniformity beyond which the implant process cannot operate with acceptable efficiency. In the event the ion source performance degrades beyond the upper threshold, the user must stop the implant operation and perform maintenance or replace the ion source. Such downtime results in productivity loss of the ion implantation system. Hence, it is desirable to maintain proper functioning of the ion source for extended periods of time in order to perform an efficient implant process.

As will be discussed, among other advantages of the present invention, an improved method and system for minimizing deposits and beam glitching during an ion implantation process is desired.

SUMMARY OF THE INVENTION

The invention relates, in part, to a composition for extending ion source life and improving ion source performance. The composition of the dopant gas utilized has been found to have a significant impact on the ability to reduce the accumulation of deposits within the ion apparatus and improve ion source performance.

It has been found that utilizing a dopant gas mixture comprising a first carbon-based species of carbon monoxide and a second carbon-based species of fluorine-containing gas having carbon and represented by the formula CxFy in an effective amount reduces carbon-based deposits and virtually eliminates tungsten regrowth and oxide deposits during a carbon implantation process. As a result, ion source life is extended. Additionally, glitching of the ion beam is significantly reduced in comparison to conventional ion implant processes and systems. The generated beam current is maintained at a sufficiently high level to achieve implantation of the ionized dopant gas at the desired dosage.

In a first aspect, a gas composition is provided, comprising a gas mixture comprising carbon monoxide and one or more fluorine-containing gases with carbon represented by the formula CxFy wherein x≥1 and y≥1, wherein the fluorine containing gases with carbon is in an effective amount of about 1-20 volume percent (vol %) based on the volume of the gas mixture.

In a second aspect, a gas composition is provided, comprising a first carbon-based species of carbon monoxide and a second carbon-based species of fluorine-containing gases with carbon represented by the formula CxFy wherein x≥1 and y≥1. The first and the second carbon-based species are each contained in an effective amount to ionize at least a portion of said first carbon-based species and said second carbon-based species to produce carbon ions.

Advantageously, the system of the present invention can be constructed utilizing system components that are commercially available, thus enabling and simplifying the overall assembly of the system and method of use thereof. Aspects of the ion implantation process can be carried out using standard techniques or equipment.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein.

DETAILED DESCRIPTION OF THE INVENTION

Figure 1:
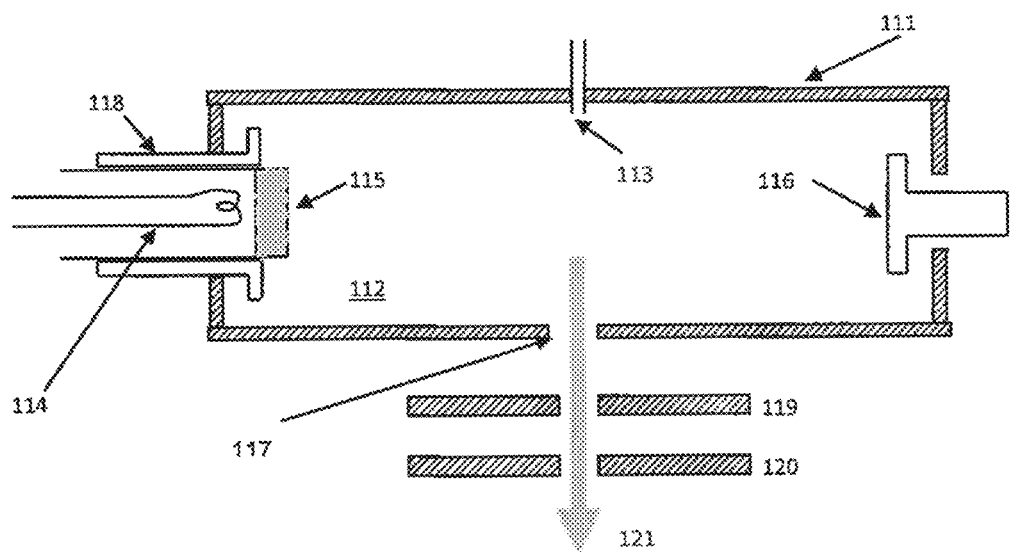
FIG. 1 shows an ion implantation apparatus incorporating the principles of the invention.

As used herein, all concentrations are expressed as volumetric percentages. With reference to FIG. 1, an exemplary ion implantation apparatus 100 in accordance with the principles of the invention is shown. The ion source apparatus 100 depicted in FIG. 1 has various components, including an indirectly heated cathode (IHC) 115 which serves as the ionizing source for the dopant gas mixture. It should be understood that other types of ion sources known in the art can be used in the present invention, including, for example, the Freeman sources, Bernas sources and RF plasma sources. The ion source apparatus 100 of FIG. 1 is preferably used for producing carbon ions for implantation into semiconductor substrates. As will be explained, the present invention allows the ion source life to be extended compared to conventional carbon dopant implantation systems by significantly reducing the amount of carbon-based and oxide-based deposition onto surfaces of the apparatus 100. The term "carbon-based deposits" as used herein includes elemental carbon, tungsten carbide, and other deposits containing carbon. The term "oxide-based deposits" as used herein includes oxidation of various ion chamber components, such as, for example, tungsten oxide (WOx). Further, the present invention advantageously eliminates elemental tungsten (W) regrowth onto surfaces of the apparatus 100. Additionally, the overall performance of the ion source is improved with respect to reductions in beam glitch rate and more uniform beam current compared to conventional ion beam sources generated for carbon ion implantation.

Referring to FIG. 1, a dopant gas mixture 102 is introduced into the ion source chamber 112 through a gas feed line 113 extending through arc chamber wall 111. The term "dopant gas mixture" as used herein means that each of the species of the dopant gas mixture contributes to the implantation of the desired ion species into a given workpiece. In the preferred embodiment, the dopant gas mixture 102 is a carbon dopant gas mixture that includes two carbon-based species. The first carbon-based species is CO. The second carbon-based species is a fluorine-containing gas with carbon. The carbon dopant gas mixture 102 inside the chamber 112 is subject to ionization by applying a predetermined voltage from a power supply source (not shown) to resistively heat a filament 114 positioned in close proximity to the IHC 115. The filament 114 may be negatively biased relative to the IHC 115. Insulator 118 electrically and thermally isolates IHC 115 from the arc chamber wall 111. Electrons emitted from the filament 114 accelerate towards the IHC 115 to heat the IHC 115 to its own thermionic emission temperature. The electrons emitted by the cathode 115 accelerate and travel towards the arc chamber 112 to ionize the carbon dopant gas mixture 102 located therein. The ionized gas molecules of the carbon dopant gas mixture 102 produce a plasma environment. Repeller electrodes 116 may be provided placed diametrically opposed to the IHC 115 to confine the plasma environment and control the ionization of the dopant gas mixture 102 within the chamber 112. Ionization of the carbon dopant gas mixture 102 causes the fluorine to be released as either fluorine anions, cations, radicals or combinations thereof, which can then react in-situ by etching any carbon deposits which may have accumulated onto surfaces of the wall 111, filament 114, suppression electrodes 119, ground electrodes 120 and/or repeller electrodes 116. Such deposits are converted into volatile carbon fluorides, thereby reducing the overall accumulation of carbon-based deposits along the various surfaces. Additionally, the fluoride ions and radicals can simultaneously recombine with carbon ions and carbon radicals present in the gas phase and formed from ionization of the dopant gas mixture. As a result, further carbon-based deposition within the chamber 112 is prevented. The net result is a significant reduction of carbon-based deposits along surfaces of the ion source apparatus 100.

In addition to the above mentioned scavenging effects of the fluorine-containing gas with carbon, each of the species of the dopant gas mixture upon ionization produces carbon ions that form a portion of the resultant carbon ion beam. In this manner, unlike the prior art, the present invention utilizes a dual purpose dopant gas mixture in which each of the species of the dopant gas mixture provides a source of carbon ions for implantation while simultaneously capable of in-situ self-cleaning of deposits and prevention of specific types of deposition (i.e., W regrowth and oxide-based deposits).

The carbon ions are extracted from the ion source chamber 112 in the form of the carbon ion beam of desired energy. The techniques for suitable extraction can be carried out by applying a high voltage across extraction electrodes, which consists of suppression electrodes 119 and ground electrodes 120. As shown in FIG. 1, each of these suppression and ground electrodes 119 and 120, respectively, has an aperture aligned with the extraction aperture 117 to ensure that the ion beam 121 extracted out of the arc chamber 112 is well-defined. The resultant ion beam 121 can be transported through a mass analyzer/filter to select a specific mass ion to be implanted into a workpiece. The ion beam 121 can then be transported to the surface of a workpiece, such as a semiconductor wafer, for implantation of the carbon ions therein. The carbon ions of the beam 121 penetrate the surface of the semiconductor wafer to form a doped region of a certain depth with desired electrical and/or physical properties.

Applicants have recognized the benefits of CO over CO2. The CO species of the dopant gas mixture 102 behaves as a reducing gas in the ion source chamber 112 environment. CO2, on the other hand, behaves as an oxidizing gas which tends to oxidize tungsten chamber components to form WOx deposits. These WOx deposits are typically found within regions of the repeller electrodes 116, cathode electrodes 115 and/or extraction assembly (i.e., suppression electrodes 119 and ground electrodes 120) of the apparatus 100. WOx deposits can be conductive in nature and can cause electrical shorting as well as ion source glitching. To further compound the problem, the WOx deposits generate particles in the ion beam line. Additionally, WOx formation on the W liner or other W components can deteriorate the electrical properties, thereby requiring higher voltage to sustain a stable plasma.

CO avoids such processing challenges. The reducing nature of the CO species creates an environment within the chamber 112 that is not conducive to formation of oxide layer deposits so as to eliminate detection of any oxide layer formation along surfaces of the ion implantation apparatus 100. Although lack of oxygen content in CO compared to CO2 reduces the accumulation of WOx deposits, CO by itself is not a suitable dopant gas source for carbon ion implantation because of the large amount of carbon and tungsten carbide deposits formed. Specifically, C deposits can be formed as a result of plasma decomposition of CO, whereas WC deposits can form due to interaction of CO and its plasma fragmented products with W chamber components.

To mitigate the carbon-based deposits resulting from CO alone, Applicants identified that a dopant gas mixture of the CO in combination with a fluorine-containing gas having carbon performed significantly well to reduce the carbon deposition observed when CO alone is used. In a preferred embodiment, the fluorine-containing gas is carbon tetrafluoride (CF4) that does not contain oxygen. In an alternative embodiment, the fluorine-containing gas may be a hydrofluorocarbon that does not contain oxygen.

In yet another embodiment, it is contemplated that CO mixed with higher order fluorocarbons of formula $C_aF_b$ where a≥2 and b≥2 may also be used to form the dopant gas mixture. Examples of suitable fluorine-containing gases of higher order fluorocarbons may include but are not limited to $C_2F_6$, $C_2F_4$, $C_3F_8$ and $C_4F_8$.

The combination of the carbon monoxide with the fluorine-containing gas consists of the entire dopant gas mixture and specifically excludes incorporation of additional oxygen, for the purpose of eliminating oxide layer growth and retaining longer ion source life, lower beam glitch rate and uniform beam current.

Further, Applicants have demonstrated that it is necessary to maintain the concentration of fluorine containing gas in the dopant gas mixture of the present invention in a narrow range to achieve desired performance for carbon implantation. The concentration of the fluorine-containing gas within the dopant gas mixture is about 1% to about 20%, more preferably between about 3% to about 13%, and more preferably between about 5% to about 10%, based on the volume of the dopant gas mixture. When the fluorine-containing gas is below the lower limit, the carbon deposition tends to increase to an unacceptable high level to severely shorten ion source life. On the other hand, when the fluorine-containing gas is above the upper limit, the fluorine has a tendency to interact with chamber components formed from tungsten, thereby causing volatile tungsten fluorides (e.g., $WF_x$, where x=1 to 6) to form and thereafter migrate to hotter surfaces inside the ion source where they can redeposit as elemental tungsten (W) and potentially cause premature failure of the ion source. Operating the ion source apparatus 100 with a dopant gas mixture having the fluorine-containing gas in a specific composition range unexpectedly provides a sufficient amount of fluorine to reduce the amount of deposits onto chamber surfaces derived from carbon yet not exceed an upper limit whereby tungsten redeposition is prone to occur.

Accordingly, the combination of CO with the fluorine-containing gas within a specific concentration range creates an improved dopant gas mixture capable of minimizing a wide array of problematic deposits onto surfaces of the chamber 112 without compromising the ability of the CO and the fluorine-containing gases to each provide carbon ions to produce a carbon ion beam having sufficient beam current. The dopant gas mixture within the specific concentration range is a novel hybrid composition which can mitigate deposition but yet maintain a required ion beam current to meet productivity requirements.

Applicants have performed several experiments to compare the dopant gas mixture of the present invention with other dopant gas materials, as will now be discussed.

Comparative Example 1

Figure 2:
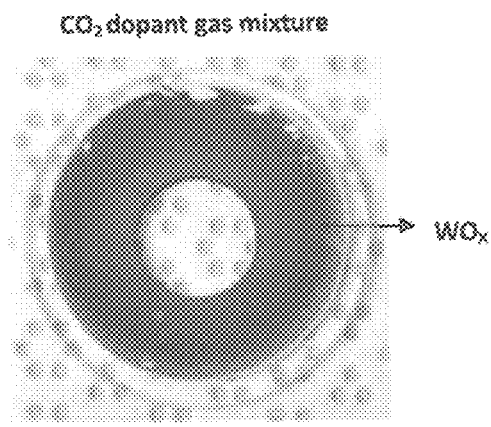
FIG. 2 shows the results of an ionization test utilizing a CO2-based dopant gas mixture.

An ionization test was performed to evaluate the ability of a dopant gas composed of $CO_2$ to produce a beam of carbon ions. The ionization process was required to be aborted after a short duration of operation due to accumulation of WOx deposits within the ionization chamber. FIG. 2 shows deposits formed on a substrate disposed inside the ion-source chamber which indicates the extent of deposits formed inside the ionization chamber. The deposits on the substrate plate were analyzed utilizing a x-ray spectroscopy technique as known in the art. The WOx deposits appeared flaky in nature. Excessive residue formation and short ion source life was attributed to the oxidizing nature of $CO_2$ plasma which resulted in oxidation of tungsten (W) components in the source chamber to produce the tungsten oxide (WOx) deposits.

Comparative Example 2

Figure 3:
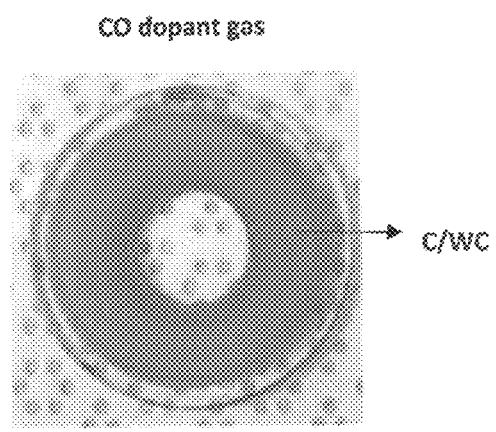
FIG. 3 shows the results of an ionization test utilizing a dopant gas of CO.

An ionization test was performed to evaluate the ability of a dopant gas composed of pure CO to produce a beam of carbon ions. Although WOx deposits were not detected, it was observed that utilizing pure CO as the dopant gas source resulted in formation of heavy carbon (C) deposits and tungsten-carbide (WC) deposits during the operation of the ion source (FIG. 3). Deposits were analyzed by x-ray spectroscopy. The ionization process was required to be aborted, as the observed C and WC deposits caused glitching of the ion beam, which resulted in unstable beam current during the ionization process. It is believed that the C deposits were the result of plasma decomposition of CO, and that the WC deposits were the result of interaction of the CO and its plasma fragmented products with tungsten chamber components. The effects of C/WC deposits were similar to WOx and as a result, a CO-based dopant gas suffered from similar concerns of short ion source life as a $CO_2$-based dopant gas mixture.

Example 3

Figure 4:
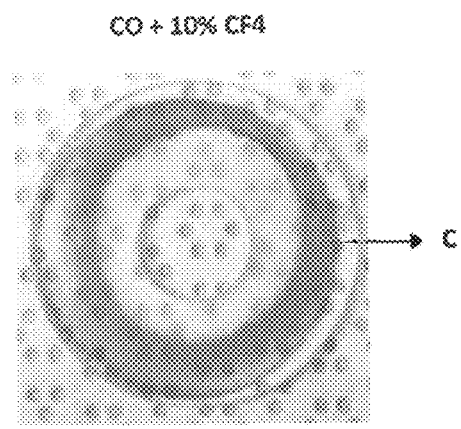
FIG. 4 shows the results of an ionization test utilizing a dopant gas mixture containing CO and 10% CF4.

An ionization test was performed to evaluate the ability of a dopant gas composed of CO and 10% CF4 on a volume basis to produce a beam of carbon ions utilizing the same ion source chamber performed for the tests above. The amount of deposits observed along the surface of the substrate plate was substantially less than the deposits which formed when utilizing pure CO or CO2-based dopant gases, as indicated by the less dark ring of deposits around the substrate plate. It was observed that utilizing CO+10% CF4 did not cause significant accumulation of any oxide deposits, carbon deposits, tungsten carbide deposits or tungsten oxide deposits (FIG. 4). Analysis of the deposits by x-ray spectroscopy indicated some carbon deposition, but not to the extent that ion beam glitching occurred.

The above tests in Examples 1-3 demonstrate that CO+10% CF4 performed better than CO alone or a CO2-based dopant gas mixture. The next series of tests shown below compared various concentration levels of CF4 in a dopant gas mixture with the balance CO.

Example 4

Figure 5:
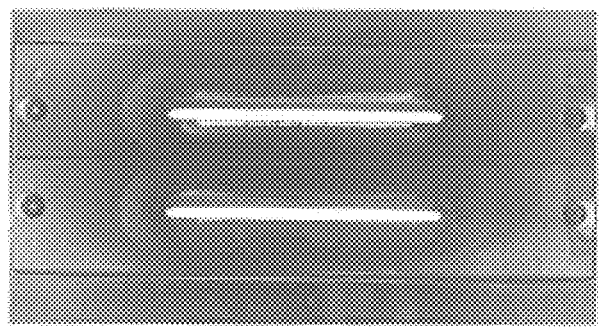
FIG. 5 show the results of an ionization test utilizing a dopant gas CO within the ion apparatus of FIG. 1.

For purposes of establishing a baseline and confirming the results obtained in Comparative Example 2, an ionization test was performed to evaluate the ability of a dopant gas composed of CO and not containing CF4 to produce a beam of carbon ions. The ion source apparatus utilized was similar to that shown in FIG. 1. CO dopant gas was introduced into an ion source apparatus. Voltage was applied to the ion source IHC to ionize the CO. During the ionization process, a large amount of C and WC deposits were observed along the surfaces of the suppression electrodes as shown in FIG. 5.

Example 5

Figure 6A:
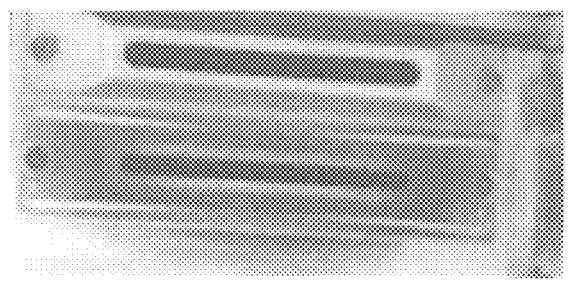
FIGS. 6a and 6b show the results of an ionization test utilizing a dopant gas mixture containing CO and 5% CF4 within the ion apparatus of FIG. 1.
Figure 6B:
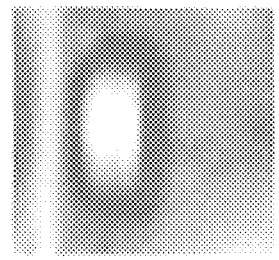

Having established a baseline when using CO in the ion source apparatus 100 of FIG. 1, an ionization test was performed employing a dopant gas mixture of CO+5% CF4. During ionization of the dopant gas mixture, a relatively small amount of carbon-based deposits (C and WC) were observed along the surfaces of the suppression electrodes, as shown in FIG. 6a. Virtually no W regrowth was observed along the repeller electrodes, as evident by the absence of whisker-like structures along surfaces of the repeller electrodes shown in FIG. 6b.

Example 6

Figure 7A:
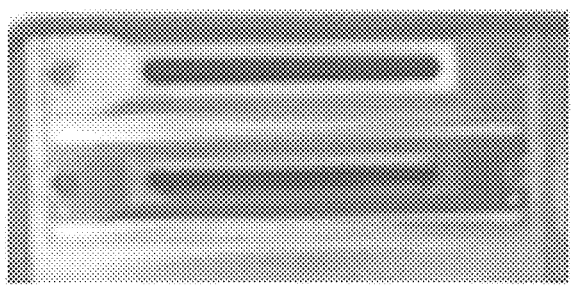
FIGS. 7a and 7b show the results of an ionization test utilizing a dopant gas mixture containing CO and 10% CF4 within the ion apparatus of FIG. 1.
Figure 7B:
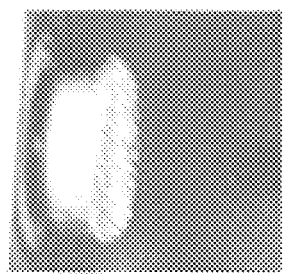

An ionization test was performed to evaluate the ability of a dopant gas mixture composed of CO and 10% CF4 on a volume basis to produce a beam of carbon ions utilizing the ion beam apparatus of FIG. 1. During ionization of the dopant gas mixture, a relatively small amount of carbon-based deposits (C and WC) were observed along the surfaces of the suppression electrodes, as shown in FIG. 7a. The amount of C and WC deposits was comparable to that of FIG. 6a. Some W whisker-like structures along surfaces of the repeller electrodes were observed, as shown in FIG. 7b.

Example 7

Figure 8A:
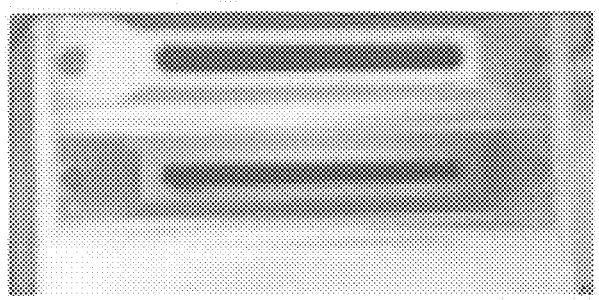
FIGS. 8a and 8b show the results of an ionization test utilizing a dopant gas mixture containing CO and 15% CF4 within the ion apparatus of FIG. 1.
Figure 8B:
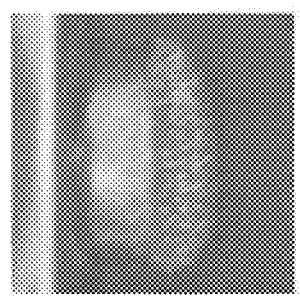

Another ionization test was performed, utilizing CO+15% CF4 as the dopant gas mixture. The amount of C and WC deposits along the surfaces of the suppression electrodes is shown in FIG. 8a. The amount of C and WC deposits observed was comparable to that when ionizing CO+5% CF4 in Example 5 and ionizing CO+10% CF4 in Example 6. However, the amount of W regrowth observed, as shown in FIG. 8b, along the surfaces of the repeller electrodes was significantly higher in comparison to the previous tests.

The above tests of Examples 4-7 indicate that a dopant gas mixture containing increased amounts of CF4 will not necessarily minimize the amount of C, WC and W deposition. The experiments reveal that there is an upper limit to the concentration of CF4 within the dopant gas mixture. Specifically, the Examples indicate that a dopant gas mixture at 15% $CF_4$ addition results in excessive W regrowth on the repeller, as shown in FIG. 8b. Excessive W deposition adversely impacts the ion source performance and results in shorten ion source life. Accordingly, there appears to be a concentration range of CF4 which minimizes formation of the deposits.

Adequate ion beam performance as measured by a sufficiently high beam current, is another design attribute that the dopant gas mixture must exhibit. A reduced beam current requires the ion apparatus to run harder (i.e., utilize greater power consumption requirements). As a result, the workpieces need to be processed longer to achieve the required dopant dosage that is implanted into the workpieces. Longer processing times and higher power consumption requirements can translate into substantially less productivity of the beam equipment, as well as a tendency for the ion source to degrade more quickly. Further, even if a given dopant gas can generate a higher beam current, the dopant gas may be prone to a greater accumulation of deposition due to longer processing times, thereby causing the ion source to be subject to more frequent beam glitching and/or non-uniformity of beam current. By way of example, although CO by itself is capable of generating relatively high beam currents, it has a tendency to deposit a large amount of carbon and tungsten carbide deposits such that the ion source life is severely shortened so that the desired workpiece productivity is never realized. Accordingly, the dopant gas mixture must be capable of generating and maintaining a sufficiently high and uniform beam current while minimizing deposition during the ion implantation process in order to achieve the desired dopant dosage and maintain acceptable productivity.

In the present invention, it has been found that introducing a dopant gas mixture in an ion source chamber that comprises CO and a second carbon-based species represented by the formula CxFy wherein x≥1 and y≥1, allows the requisite balance of ion source life with ion source performance to be achieved when the CxFy is present in an optimal concentration range. Generally speaking, too high a level of fluorine-containing species with carbon (i.e., CxFy) results in an unacceptably low ion beam current level, and too low a level of the CxFy species results in a high amount of carbon and tungsten deposition and therefore poor ion source life. A specific range of the CxFy at about 3-12 volume percent (vol %) achieves sufficient ion source life and improved ion source performance in comparison to conventional carbon ion implant processes.

It is also envisioned that CO may be mixed with more than one fluorine containing C gas to achieve desired dopant gas mix. The fluorine containing C gas may be chosen from but not limited to CF4, C2F6, C2F4, C2F2, C4F8.

It should be understood that the gas composition of the present invention has other applications. For instance, the gas composition can be utilized in chemical vapor deposition or atomic layer deposition processes under suitable processing conditions to alter the gas mixture chemistry so as to cause deposition of a thin film carbon layer. Alternatively, the gas composition can also be utilized to reduce a metal oxide layer to a metallic layer. By way of example, tungsten oxide can be annealed in a CO+CF4 environment to reduce the tungsten oxide to a metallic tungsten layer. CO acts as a reducing gas to extract oxygen from the tungsten oxide layer, thereby reducing the tungsten oxide to elemental tungsten. Additionally, the presence of the CF4 may accelerate the reduction of tungsten oxide to elemental tungsten by potentially fluorinating the tungsten oxide layer, thereby enhancing its removal rate. The net result is the ability for tungsten oxide to revert to a pure tungsten layer more quickly.

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A gas composition for use in a carbon implantation system, comprising:
   a dopant gas mixture in an ion source apparatus comprising carbon monoxide and one or more fluorine-containing gases with carbon represented by the formula CxFy wherein x≥1 and y≥1, the mixture characterized by the absence of additional oxygen;
   wherein the fluorine containing gases with carbon is in an effective amount of about 1-20 volume percent (vol %) based on the volume of the gas mixture;
   wherein the dopant gas mixture releases carbons ions to produce a carbon ion beam under conditions sufficient to reduce carbon-based deposits and oxide-based deposits during carbon implantation.

2. The gas composition of claim 1, wherein at least one of the fluorine containing gases with carbon is in an effective amount of about 3-15 vol % based on the volume of the gas mixture.

3. The gas composition of claim 1, wherein at least one of the fluorine containing gases with carbon is in an effective amount of about 5-10 vol % based on the volume of the gas mixture.

4. The gas composition of claim 1, wherein the one or more fluorine containing gases with carbon is selected from the group consisting of C2F6, CF4, C4F8, C2F4 and mixtures thereof.

5. The gas composition of claim 1, wherein the one or more fluorine-containing gases with carbon is CF4 in an effective amount of about 3-10 vol % based on the volume of the gas mixture.

6. The gas composition of claim 1, wherein the fluorine-containing gas with carbon is C2F6 in an effective amount of about 3-10 vol % based on the volume of the gas mixture.

7. The gas composition of claim 1, wherein the fluorine-containing gas with carbon is C2F6 in an effective amount of about 5-10 vol % based on the volume of the gas mixture.

8. The gas composition of claim 1, wherein the fluorine containing gas with carbon is selected from the group consisting of C2F6, CF4, C4F8, C2F4 and mixtures thereof, and further wherein fluorine containing gas is contained in an effective amount of about 3-15 vol % based on the volume of the gas mixture.

9. The gas composition of claim 1, wherein x=1 to 6 and y=1 to 10.

10. A gas composition for use in carbon implantation, comprising:
a dopant gas mixture in an ion source apparatus comprising a first carbon-based species of carbon monoxide and a second carbon-based species of fluorine-containing gases with carbon represented by the formula $C_xF_y$ wherein $x \geq 1$ and $y \geq 1$, the first and the second carbon-based species each contained in an effective amount to ionize at least a portion of said first carbon-based species and said second carbon-based species to produce carbon ions said mixture characterized by the absence of additional oxygen;
wherein the dopant gas mixture releases carbons ions to produce a carbon ion beam under conditions sufficient to reduce carbon-based deposits and oxide-based deposits during carbon implantation.

11. The gas composition of claim 10, wherein the second carbon-based species with carbon is in an effective amount of about 1-20 volume percent (vol %) based on the volume of the gas mixture.

12. The gas composition of claim 10, further comprising hydrogen.

13. The gas composition of claim 10, wherein the second carbon-based species is selected from the group consisting of C2F6, CF4, C4F8, C2F4 and mixtures thereof.

14. The gas composition of claim 10, wherein the second carbon-based species is CF4 in an effective amount of about 3-10 vol % based on the volume of the gas mixture.

15. The gas composition of claim 10, wherein at least a portion of the fluorine ionizes from the second carbon-based species.

* * * * *